(12) United States Patent
Lan et al.

(10) Patent No.: US 12,159,864 B2
(45) Date of Patent: Dec. 3, 2024

(54) LAYOUT STRUCTURE WITH MINIMAL ADDITIONAL PARASITIC CAPACITANCE

(71) Applicant: ALi Corporation, Hsinchu (TW)

(72) Inventors: Tzu-Wei Lan, Taipei (TW); Wei-Jian Lin, Taipei (TW)

(73) Assignee: ALi Corporation, Hsinchu (TW)

( * ) Notice: Subject to any disclaimer, the term of this patent is extended or adjusted under 35 U.S.C. 154(b) by 387 days.

(21) Appl. No.: 17/525,966

(22) Filed: Nov. 15, 2021

(65) Prior Publication Data

US 2022/0165723 A1 May 26, 2022

(30) Foreign Application Priority Data

Nov. 25, 2020 (CN) .......................... 202011335838.8

(51) Int. Cl.
*H01L 27/01* (2006.01)
*G06F 30/398* (2020.01)
*H03M 1/38* (2006.01)

(52) U.S. Cl.
CPC ............ *H01L 27/01* (2013.01); *G06F 30/398* (2020.01); *H03M 1/38* (2013.01)

(58) Field of Classification Search
CPC ..... H01L 27/01; H01L 28/40; H01L 27/0207; G06F 30/398; H03M 1/38
See application file for complete search history.

(56) References Cited

U.S. PATENT DOCUMENTS

| 5,925,921 | A  | * | 7/1999 | Susak | .................. H01L 23/5223 257/532 |
| 10,770,457 | B2 | * | 9/2020 | Jones, III | ............ H01L 23/5223 |
| 11,728,336 | B2 | * | 8/2023 | Jones, III | ................ H03M 1/00 257/306 |

(Continued)

FOREIGN PATENT DOCUMENTS

| CN | 101174620 | 5/2008 |
| CN | 103023504 | 4/2013 |

(Continued)

OTHER PUBLICATIONS

"Office Action of China Counterpart Application", issued on Aug. 24, 2024, p. 1-p. 7.

*Primary Examiner* — Caleb E Henry
(74) *Attorney, Agent, or Firm* — JCIPRNET

(57) ABSTRACT

Provided is a layout structure adapted for a signal format converter. The layout structure includes a first and a second capacitor array. The first capacitor array is disposed on one side of a reference axis, and includes multiple first capacitor units that form multiple first capacitors. The first capacitors respectively have multiple first capacitances. The second capacitor array is disposed on the other side of the reference axis, and includes multiple second capacitor units that form multiple second capacitors. The second capacitors respectively have multiple second capacitances. The first capacitors respectively correspond to the second capacitors. Each first capacitor and each corresponding second capacitor are symmetrical with respect to the reference axis, or each first (Continued)

capacitor and each corresponding second capacitor are separated from each other by the same distance. Each first capacitor and each corresponding second capacitor have the same capacitance.

9 Claims, 7 Drawing Sheets

(56) References Cited

U.S. PATENT DOCUMENTS

| | | | | |
|---|---|---|---|---|
| 2008/0100989 | A1* | 5/2008 | Chen | H01L 27/0805 |
| | | | | 257/E27.048 |
| 2008/0122670 | A1* | 5/2008 | Klaassen | H03M 1/0612 |
| | | | | 341/144 |
| 2013/0200489 | A1* | 8/2013 | Huang | H01L 23/5223 |
| | | | | 257/532 |
| 2013/0270671 | A1* | 10/2013 | Lu | H01L 27/016 |
| | | | | 257/532 |
| 2015/0236711 | A1 | 8/2015 | Aruga et al. | |
| 2018/0351568 | A1 | 12/2018 | Hiraide et al. | |
| 2018/0358427 | A1* | 12/2018 | Lan | H01L 28/86 |
| 2020/0144253 | A1* | 5/2020 | Jones, III | H01L 23/53204 |
| 2020/0357794 | A1* | 11/2020 | Jones, III | H01L 28/60 |
| 2022/0100940 | A1* | 3/2022 | Weng | H01G 15/00 |

FOREIGN PATENT DOCUMENTS

| | | |
|---|---|---|
| CN | 111786677 | 10/2020 |
| CN | 108476024 | 1/2022 |
| WO | 2020036479 | 2/2020 |

\* cited by examiner

LAYOUT STRUCTURE WITH MINIMAL ADDITIONAL PARASITIC CAPACITANCE

CROSS-REFERENCE TO RELATED APPLICATION

This application claims the priority benefit of Chinese application serial no. 202011335838.8, filed on Nov. 25, 2020. The entirety of the above-mentioned patent application is hereby incorporated by reference herein and made a part of this specification.

BACKGROUND

Technical Field

The disclosure relates to a layout structure, particularly to a layout structure with minimal additional parasitic capacitance.

Related Art

In today's semiconductor industry, capacitors are important and essential components. Among the capacitors, a metal-oxide-metal (MOM) capacitor structure is a common capacitor structure having a basic design in which an insulating medium is filled between a positive metal plate and a negative metal plate used as two electrodes, such that the positive metal plate, the negative metal plate and the insulating medium therebetween form a capacitor unit. Generally, in the design of the capacitor structure, a unit capacitance can be increased by reducing the thickness of the insulating medium between the electrodes or by increasing the electrode surface area.

In addition, if a capacitor structure with parasitic capacitance is applied to an actual circuit, the parasitic capacitance formed by the metal plates may affect the overall circuit performance. Therefore, when designing a capacitor structure, it is important to consider how to reduce the parasitic capacitance that causes interference. With the demand for miniaturization of semiconductors, how to improve the capacitor structure under the existing process specifications to reduce the parasitic capacitance that causes interference has become an important research topic. Especially, for a circuit architecture including a large number of capacitors, the parasitic capacitance may directly affect the overall circuit performance.

For example, an architecture of a successive approximation register (SAR) analog-to-digital converter (ADC) requires a capacitor array with a large number of capacitors. However, the design of the capacitor array often causes additional parasitic capacitance, resulting in mismatch of SAR ADC capacitors, and thus an output result of the circuit is not satisfactory. Moreover, a compact arrangement adopted in designing the capacitor array in order to reduce the area used may make it difficult to integrate the capacitor array with other circuits.

SUMMARY

The disclosure is directed to a layout structure with minimal additional parasitic capacitance.

According to an embodiment of the disclosure, a layout structure is adapted for a signal format converter. The layout structure includes a first capacitor array and a second capacitor array. The first capacitor array is disposed on one side of a reference axis. The first capacitor array includes multiple first capacitor units. The multiple first capacitor units form multiple first capacitors. The multiple first capacitors respectively have multiple first capacitances. The second capacitor array is disposed on the other side of the reference axis. The second capacitor array includes multiple second capacitor units. The multiple second capacitor units form multiple second capacitors. The multiple second capacitors respectively have multiple second capacitances. The multiple first capacitors respectively correspond to the multiple second capacitors. Each first capacitor and each corresponding second capacitor are symmetrical with respect to the reference axis, or each first capacitor and each corresponding second capacitor are separated from each other by the same distance. Each first capacitor and each corresponding second capacitor have the same capacitance.

According to the above, in the layout structure of the disclosure, each first capacitor and each corresponding second capacitor are symmetrical with respect to the reference axis, or each first capacitor and each corresponding second capacitor are separated from each other by the same distance. Moreover, each first capacitor and each corresponding second capacitor have the same capacitance. Therefore, the layout structure of the disclosure enables matching of SAR ADC capacitors, thereby enabling the circuit to output a satisfactory result.

To make the aforementioned and other features and advantages of the disclosure more comprehensible, embodiments accompanied with drawings are described in detail as follows.

DESCRIPTION OF THE EMBODIMENTS

Figure 1:
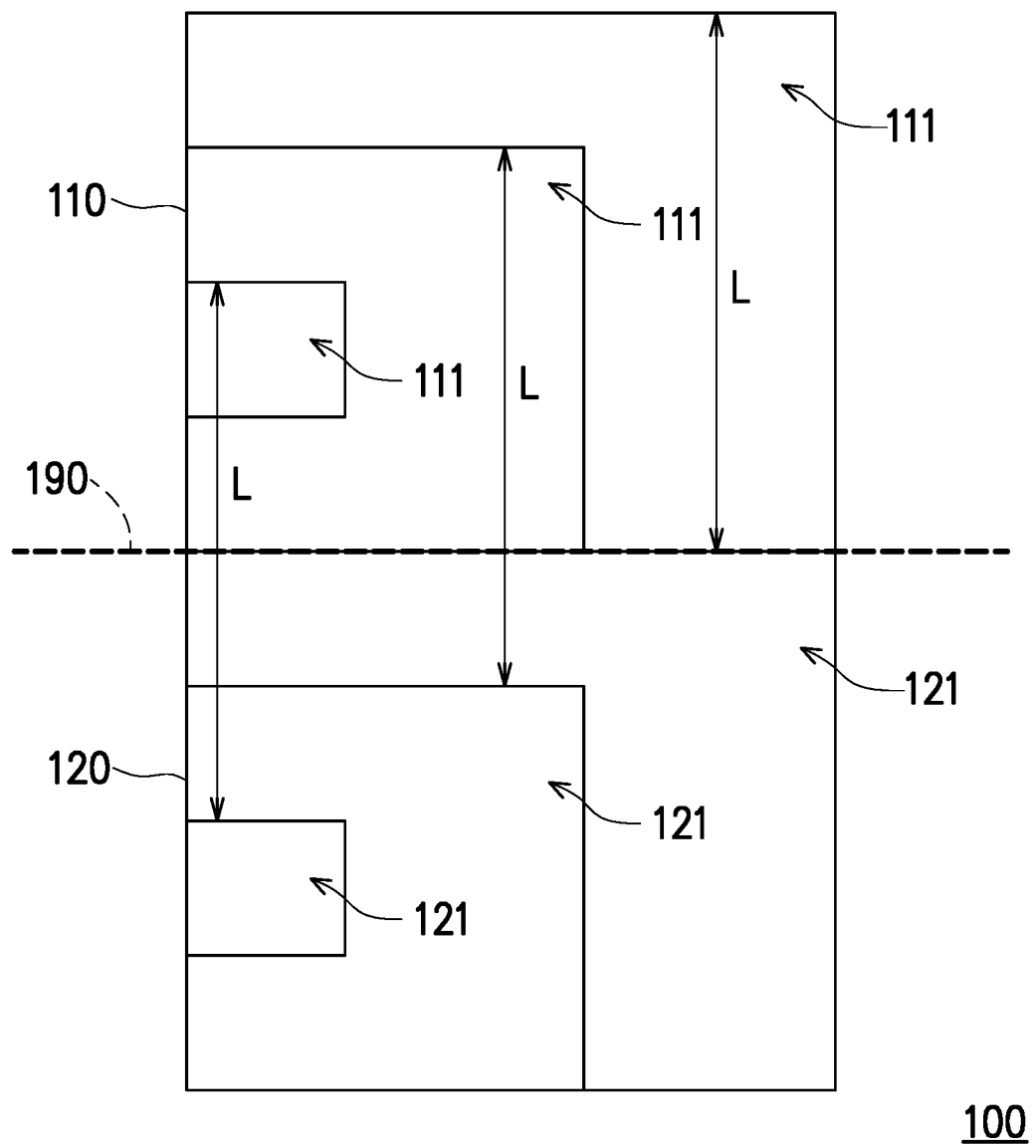
FIG. 1 shows a schematic view of a layout structure according to an embodiment of the disclosure.

Reference will now be made in detail to the exemplary embodiments of the disclosure, examples of which are illustrated in the accompanying drawings. Wherever possible, the same reference numerals are used in the drawings and the description to refer to the same or like portions. However, the disclosure may be practiced in many different forms and is not limited to the embodiments described below. In addition, for clarity, the dimensions of each layer and each element and related dimensions in the drawings may be exaggerated.

Referring to FIG. 1, FIG. 1 shows a schematic view of a layout structure according to an embodiment of the disclosure. A layout structure 100 may include a first capacitor array 110 and a second capacitor array 120. The first capacitor array 110 may be disposed on one side of a reference axis 190. The second capacitor array 120 may be disposed on the other side of the reference axis 190. The first capacitor array 110 may include multiple first capacitors 111, and the first capacitors 111 respectively have multiple first capacitances different from each other. The second capacitor array 120 may include multiple second capacitors 121, and the second capacitors 121 respectively have multiple second capacitances different from each other. In addition, the first capacitors 111 and the second capacitors 121 may each be composed of multiple capacitor units (not shown). Regarding implementation details of the capacitor units, an example is provided in FIG. 6 and FIG. 7 for description. However, the disclosure is not limited thereto.

It should be noted that the first capacitor array 110 and the second capacitor array 120 in FIG. 1 may respectively include three first capacitors 111 and three second capacitors 121. However, the numbers of the first capacitors 111 and the second capacitors 121 of the disclosure are not limited thereto.

Furthermore, in this embodiment, the first capacitors 111 in the first capacitor array 110 are respectively opposite the second capacitors 121 in the second capacitor array 120. Each first capacitor 111 and each corresponding second capacitor 121 may be separated from each other by the same distance L. Each first capacitor 111 and each corresponding second capacitor 121 may have the same capacitance. Depending on design needs, each first capacitor 111 may have a stepped shape, an L shape, a U shape or a rectangular shape. However, the disclosure is not limited thereto. Each first capacitor 111 may have the same shape as each corresponding second capacitor 121.

In terms of a layout operation, a designer may first complete the layout of the first capacitor array 110 on a first side of the reference axis 190. Then, the designer may perform the layout of the second capacitor array 120 on a second side of the reference axis 190 by copying and offsetting the first capacitor array 110.

It should be noted that the first capacitor array 110 and the second capacitor array 120 may respectively form two rectangles of the same size. Specifically, the first capacitor array 110 may be composed of multiple first capacitor units, and the second capacitor array 120 may be composed of multiple second capacitor units. Here, the first capacitor unit may be completely the same as the second capacitor unit. Moreover, multiple first capacitor units and multiple second capacitor units may respectively constitute multiple first capacitors 111 and multiple second capacitors 121. Finally, multiple first capacitors 111 may be arranged and combined together to form one rectangle, multiple second capacitors 121 may be arranged and combined together to form another rectangle, and these two rectangles have the same size. For example, referring to FIG. 1, the combination of three first capacitors 111 may form one rectangle, and the combination of three second capacitors 121 may form another identical rectangle.

In addition, multiple first capacitances may form a first geometric sequence. Multiple second capacitances may form a second geometric sequence. Moreover, the first geometric sequence and the second geometric sequence have the same common ratio. For example, the first capacitances and the second capacitances may respectively form geometric sequences with a common ratio of 2. However, the disclosure is not limited thereto.

Figure 2:
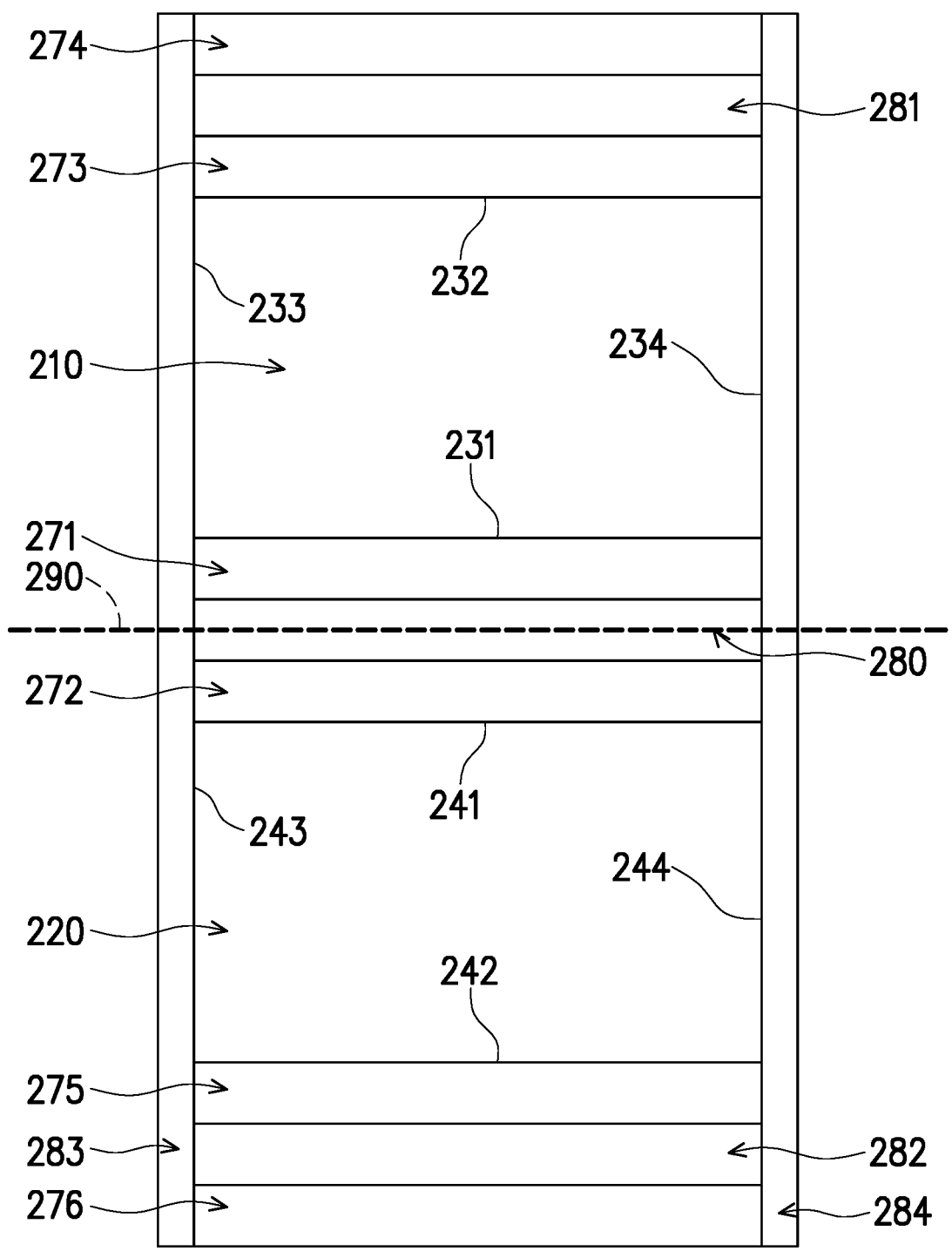
FIG. 2 shows a schematic view of a layout structure according to an embodiment of the disclosure.

Referring to FIG. 2, FIG. 2 shows a schematic view of a layout structure according to an embodiment of the disclosure. A layout structure 200 may include a first capacitor array 210, a second capacitor array 220, a compensation capacitor block 271, a compensation capacitor block 272, a compensation capacitor block 273, a compensation capacitor block 274, a compensation capacitor block 275, a compensation capacitor block 276, a redundant capacitor block 280, a redundant capacitor block 281, a redundant capacitor block 282, a redundant capacitor block 283, and a redundant capacitor block 284.

In this embodiment, the first capacitor array 210 may be disposed on one side of a reference axis 290. The second capacitor array 220 may be disposed on the other side of the reference axis 290. The compensation capacitor block 271 may be disposed between a first side edge 231 of the first capacitor array 210 and the reference axis 290, and the first side edge 231 of the first capacitor array 210 may be adjacent to the reference axis 290. The compensation capacitor block 272 may be disposed between a first side edge 241 of the second capacitor array 220 and the reference axis 290, and the first side edge 241 of the second capacitor array 220 may be adjacent to the reference axis 290.

In addition, the compensation capacitor block 271 may include multiple first compensation capacitor units (not shown), and the compensation capacitor block 272 may include multiple second compensation capacitor units (not shown). Moreover, each first compensation capacitor unit and each second compensation capacitor unit may have the same structure. In addition, in this embodiment, each first compensation capacitor unit may also have the same structure as the capacitor units that constitute the first capacitor array 210 and the second capacitor array 220.

In this embodiment, the redundant capacitor block 280 may be disposed between the compensation capacitor block 271 and the compensation capacitor block 272. The redundant capacitor block 280 may include multiple redundant capacitor units (not shown).

In this embodiment, the compensation capacitor block 273, the redundant capacitor block 281 and the compensation capacitor block 274 are sequentially disposed outside a second side edge 232 of the first capacitor array 210, in which the first side edge 231 of the first capacitor array 210 is opposite the second side edge 232 of the first capacitor array 210. The compensation capacitor block 275, the redundant capacitor block 282 and the compensation capacitor block 276 are sequentially disposed outside a second side edge 242 of the second capacitor array 220, in which the first side edge 241 of the second capacitor array 220 is opposite the second side edge 242 of the second capacitor array 220.

In this embodiment, the redundant capacitor block 283 is disposed outside a third side edge 233 of the first capacitor array 210 and a third side edge 243 of the second capacitor array 220 along a first direction (direction Y), in which the first direction (direction Y) is orthogonal to an extension direction (direction X) of the reference axis 290. The redundant capacitor block 284 is disposed outside a fourth side edge 234 of the first capacitor array 210 and a fourth side edge 244 of the second capacitor array 220 along the first direction (direction Y), in which the fourth side edge 234 and the fourth side edge 244 are respectively opposite the third side edge 233 and the third side edge 243.

It should be noted that the function of the redundant capacitor block 283 and the redundant capacitor block 284 is to reduce the impact of etching-induced unevenness of a metal layer on the layout. Moreover, the aforementioned compensation capacitors may be disposed depending on design needs. That is, the redundant capacitor block 283 may be independently disposed outside the third side edge 233 of the first capacitor array 210 and the third side edge 243 of the second capacitor array 220, and the redundant capacitor block 284 may be independently disposed outside the fourth side edge 234 of the first capacitor array 210 and the fourth side edge 244 of the second capacitor array 220, with no compensation capacitor being disposed.

Figure 3:
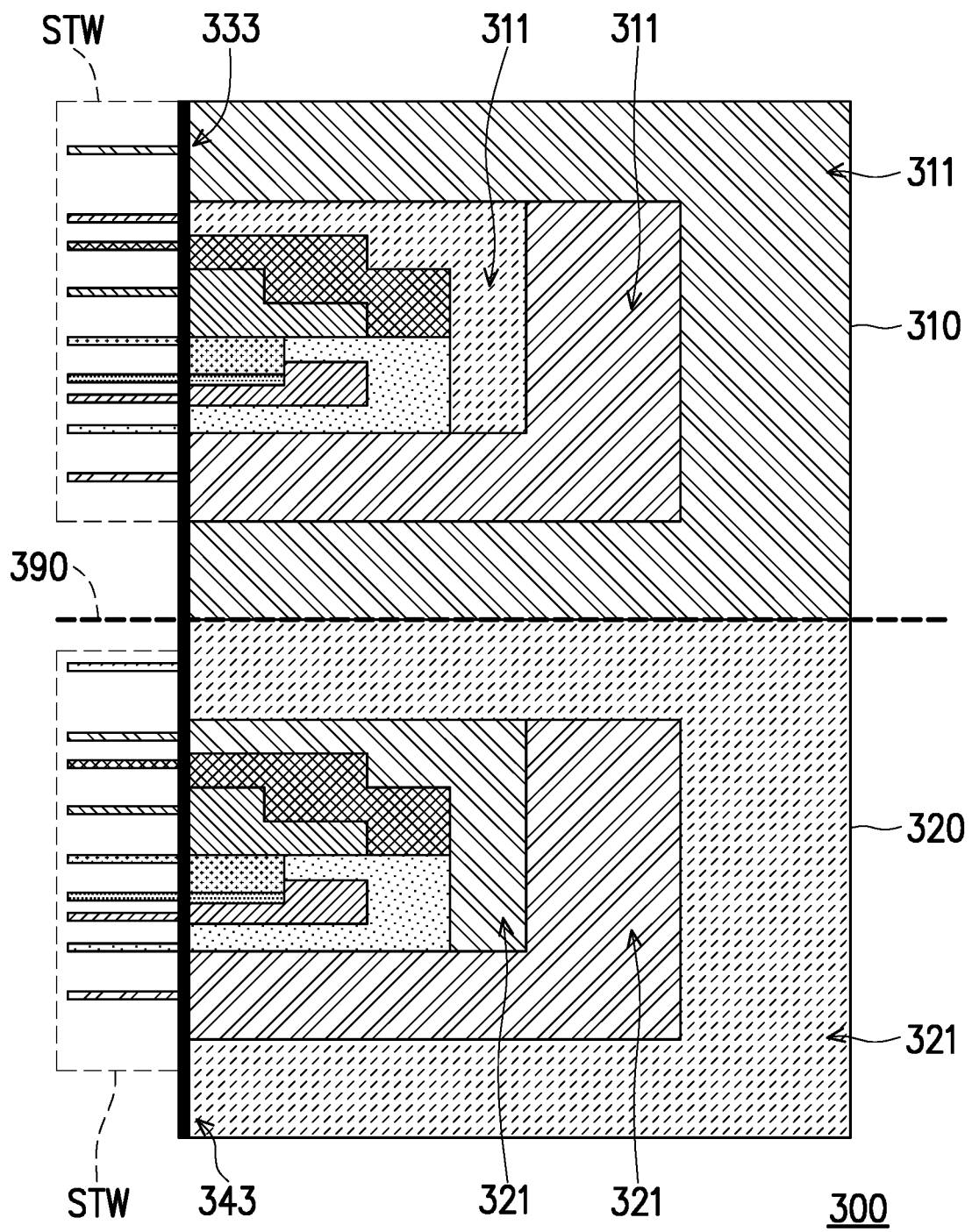
FIG. 3 shows a schematic view of an implementation of a layout structure according to an embodiment of the disclosure.

Referring to FIG. 3, FIG. 3 shows a schematic view of an implementation of a layout structure according to an embodiment of the disclosure. A layout structure 300 may include a first capacitor array 310, a second capacitor array 320, and a signal transmission wire STW. The first capacitor array 310 may include multiple first capacitors 311, and the first capacitor array 310 composed of the first capacitors 311 forms one rectangle. The second capacitor array 320 may include multiple second capacitors 321, and the second capacitor array 320 composed of the second capacitors 321 forms another identical rectangle. In this embodiment, the second capacitor array 320 may be obtained by copying the first capacitor array 310. That is, the layout of the second capacitor array 320 may be completed by translating the first capacitors 311 in the first capacitor array 310 a fixed distance from one side to the other side of a reference axis 390, and the second capacitor array 320 is thereby located on the other side of the reference axis 390. In addition, multiple signal transmission wires STW may be respectively coupled to the first capacitors 311 and the second capacitors 321 via a third side edge 333 of the first capacitor array 310 and a third side edge 343 of the second capacitor array 320.

It should be noted that the first capacitor array 310 and the second capacitor array 320 may be applied to capacitor arrays of an SAR ADC (not shown). For example, an ADC may include a capacitor array for conversion to positive bits and an ADC may include a capacitor array for conversion to negative bits. The first capacitor array 310 and the second capacitor array 320 may respectively be a capacitor array for conversion to positive bits and a capacitor array for conversion to negative bits in the SAR ADC. Since the signal transmission wires STW may be respectively coupled to the first capacitors 311 and the second capacitors 321 via the third side edge 333 of the first capacitor array 310 and the third side edge 343 of the second capacitor array 320, additional parasitic capacitance is minimized. That is, the SAR ADC has minimal additional parasitic capacitance and may output a satisfactory conversion result.

It should be noted that the first capacitors 311 in the first capacitor array 310 and the second capacitors 321 in the second capacitor array 320 may respectively correspond to different bits in the SAR ADC. For example, the first capacitor 311 with the largest area may correspond to the most significant bit (MSB) among the positive bits, and the first capacitor 311 with the smallest area may correspond to the least significant bit (LSB) among the positive bits. The corresponding second capacitors 321 in the second capacitor array 320 may respectively correspond to the MSB and LSB among the negative bits.

In addition, since the MSB is dominant in the SAR ADC, the effect of the LSB may be ignored. Therefore, each first capacitor 311 with a relatively large area and each corresponding second capacitor 321 may be separated from each other by the same distance, and each first capacitor 311 and each corresponding second capacitor 321 have the same capacitance. However, depending on design needs, each first capacitor 311 and each second capacitor 321 with a relatively small area may be separately disposed so as to simplify the layout.

Figure 4:
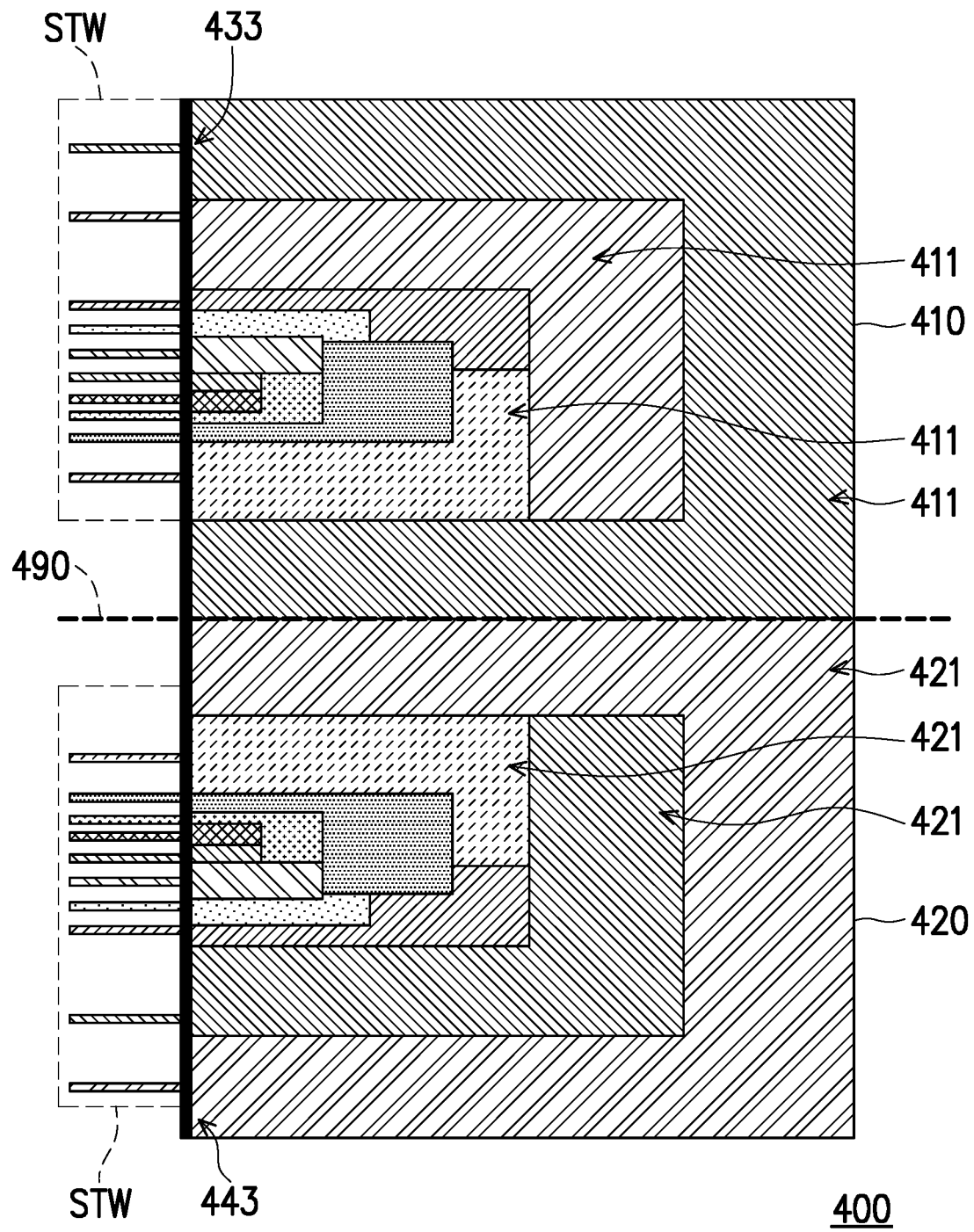
FIG. 4 shows a schematic view of an implementation of a layout structure according to an embodiment of the disclosure.

Referring to FIG. 4, FIG. 4 shows a schematic view of an implementation of a layout structure according to an embodiment of the disclosure. Refer to FIG. 3 and FIG. 4, FIG. 4 is different from FIG. 3 in that a first capacitor array 410 and a second capacitor array 420 in a layout structure 400 are respectively composed of multiple first capacitors 411 different from the first capacitors 311 in FIG. 3 and multiple second capacitors 421 different from the second capacitors 321 in FIG. 3. Another difference is that each first capacitor 411 and each corresponding second capacitor 421 may be symmetrical with respect to a reference axis 490 at the same time. It should be noted that the first capacitor array 410 and the second capacitor array 420, respectively composed of the first capacitors 411 and the second capacitors 421, form identical rectangles. In addition, multiple signal transmission wires STW may be respectively coupled to the first capacitors 411 and the second capacitors 421 via a third side edge 433 of the first capacitor array 410 and a third side edge 443 of the second capacitor array 420.

Figure 5:
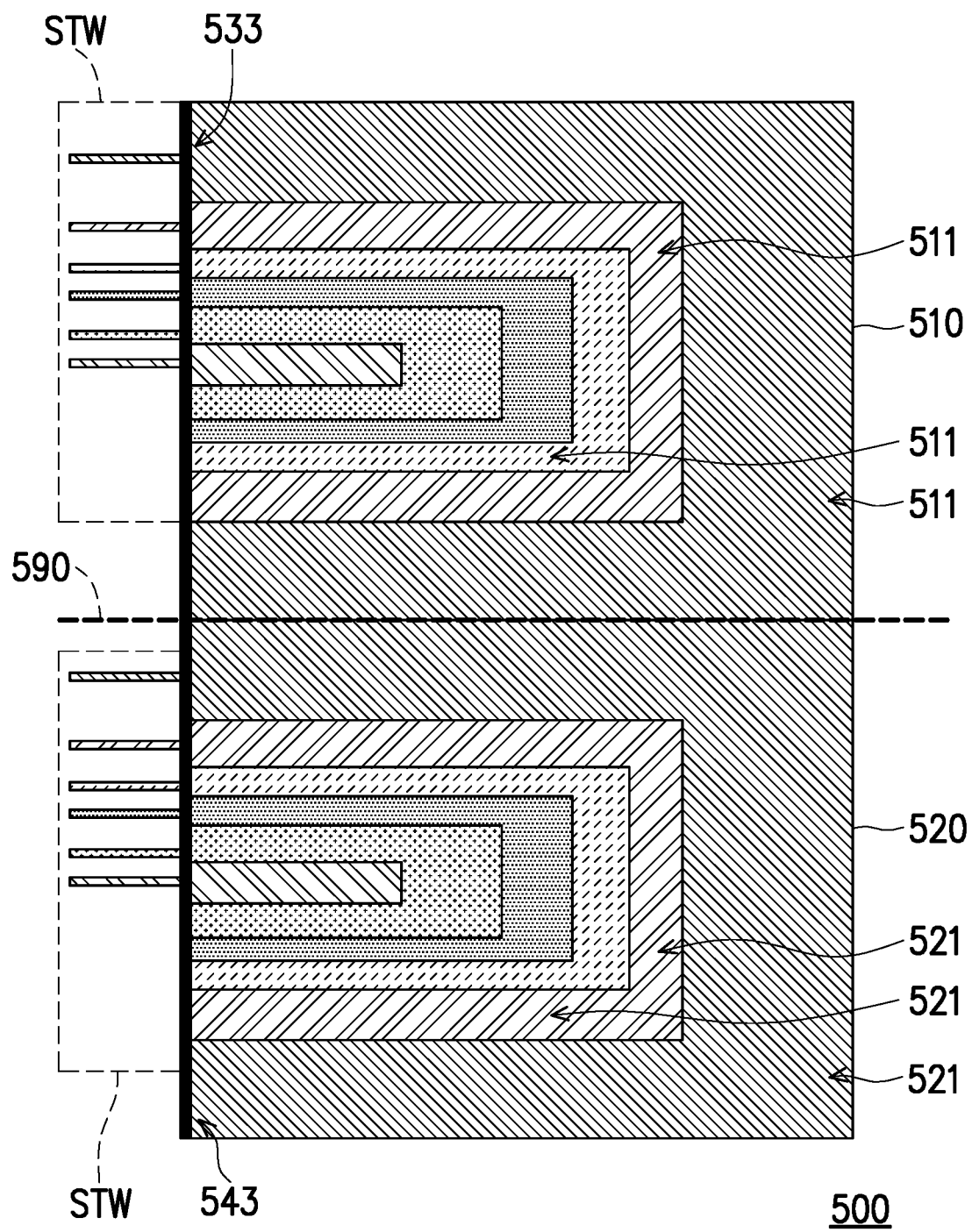
FIG. 5 shows a schematic view of an implementation of a layout structure according to an embodiment of the disclosure.

Referring to FIG. 5, FIG. 5 shows a schematic view of an implementation of a layout structure according to an embodiment of the disclosure. Refer to FIG. 3, FIG. 4 and FIG. 5, FIG. 5 is different from FIG. 3 and FIG. 4 in that, in a layout structure 500, a first capacitor 511 of a first capacitor array 510 and a second capacitor 521 of a second capacitor array 520 may both have a U shape. Similarly to FIG. 4, each first capacitor 511 and each corresponding second capacitor 521 may be symmetrical with respect to a reference axis 590 at the same time. The first capacitor array 510 and the second capacitor array 520, respectively composed of multiple first capacitors 511 and multiple second capacitors 521, form identical rectangles. In addition, multiple signal transmission wires STW may be respectively coupled to the first capacitors 511 and the second capacitors 521 via a third side edge 533 of the first capacitor array 510 and a third side edge 543 of the second capacitor array 520.

Figure 6:
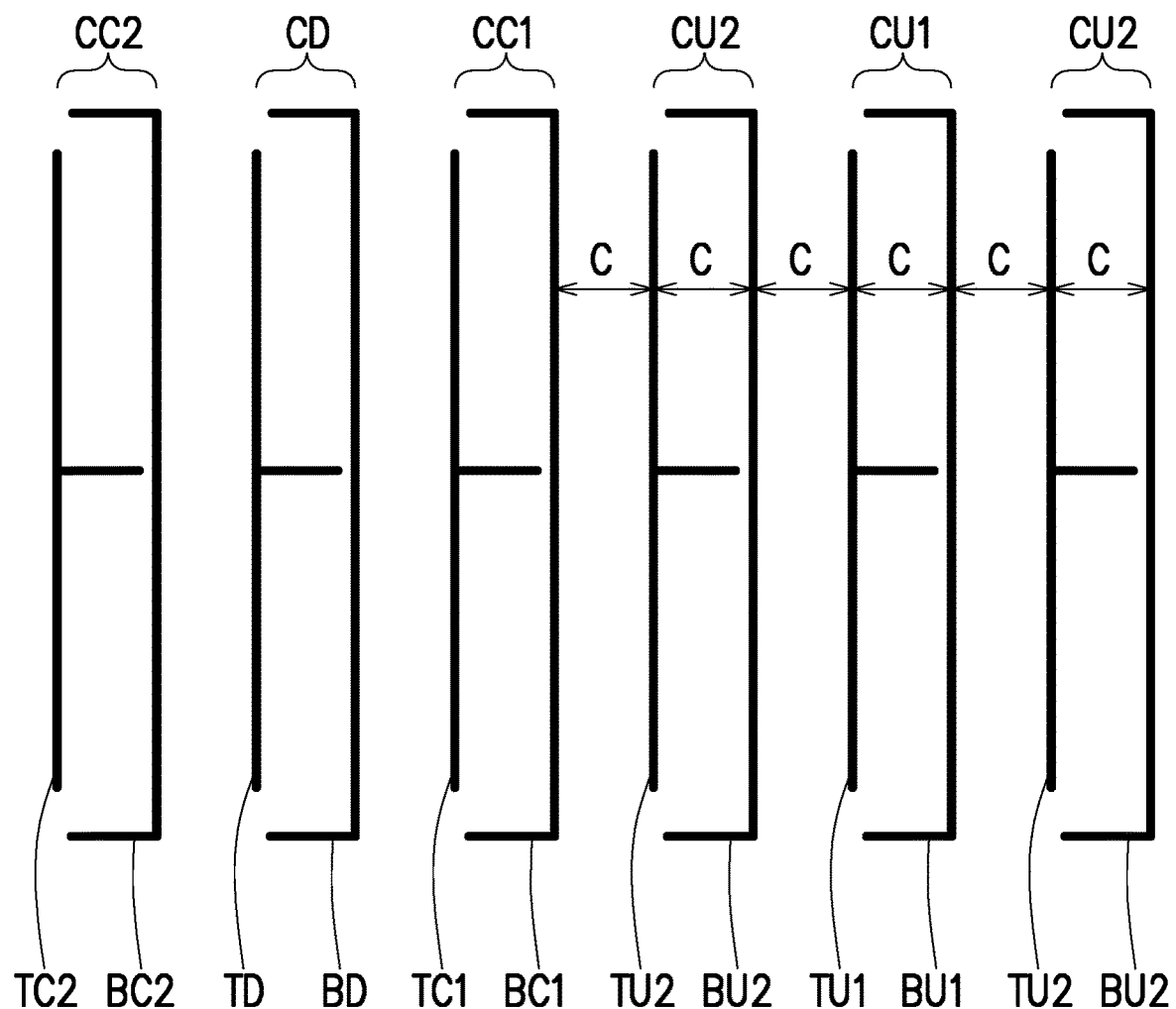
FIG. 6 shows a schematic diagram of a capacitor array according to an embodiment of the disclosure.

Referring to FIG. 6, FIG. 6 shows a schematic diagram of a capacitor array according to an embodiment of the disclosure. A capacitor array 600 may include a first capacitor unit CU1, a second capacitor unit CU2, a first compensation capacitor unit CC1, a second compensation capacitor unit CC2, and a redundant capacitor unit CD. The first capacitor unit CU1 includes an upper electrode TU1 and a lower electrode BU1, in which the upper electrode TU1 is coupled to a signal transmission wire (not shown) and the lower electrode BU1 is coupled to a ground terminal. The second capacitor unit CU2 includes an upper electrode TU2 and a lower electrode BU2, in which the upper electrode TU2 is coupled to the signal transmission wire and the lower electrode BU2 is coupled to the ground terminal. The first compensation capacitor unit CC1 includes an upper electrode TC1 and a lower electrode BC1, in which the upper electrode TC1 and the lower electrode BC1 are both coupled to the ground terminal. The second compensation capacitor unit CC2 includes an upper electrode TC2 and a lower electrode BC2, in which the upper electrode TC2 and the lower electrode BC2 are both coupled to the ground terminal. The redundant capacitor unit CD includes an upper electrode TD and a lower electrode BD, in which the upper electrode TD is coupled to a reference voltage terminal (not shown) and the lower electrode BD is coupled to the ground terminal.

In this way, the upper electrode TU1 of the first capacitor unit CU1 has the same equivalent parasitic capacitance on left and right sides thereof, and the upper electrode TU2 of the second capacitor unit CU2 has the same equivalent parasitic capacitance on left and right sides thereof. Moreover, a capacitance C may be provided between every two electrodes from the lower electrode BU2 of the second capacitor unit CU2 on the rightmost side to the lower electrode BC1 of the first compensation capacitor unit CC1.

Therefore, by the above configuration, the additional parasitic capacitance of the capacitor array 600 can be minimized.

Figure 7:
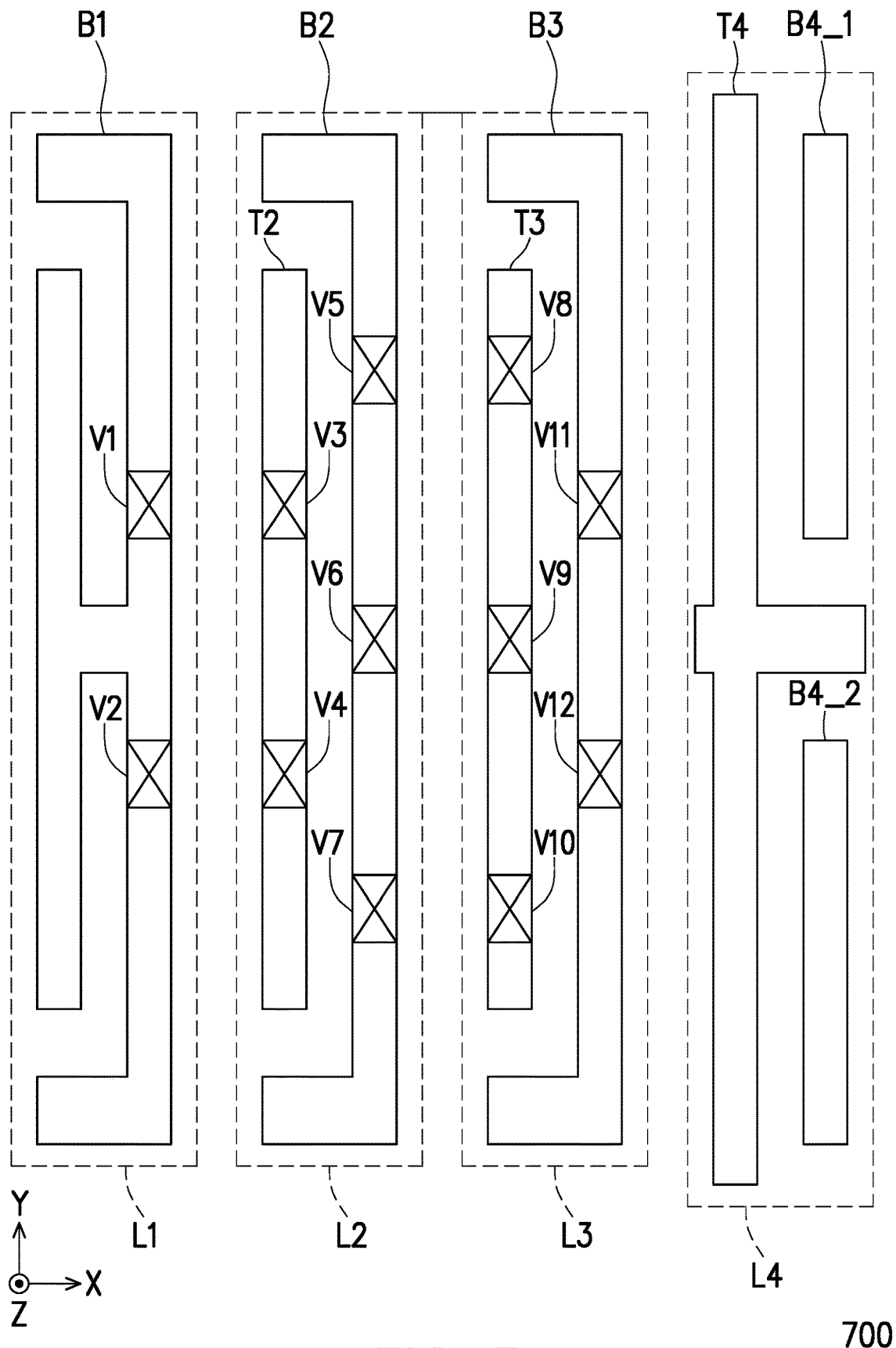
FIG. 7 shows a schematic top view of a capacitor unit according to an embodiment of the disclosure.

Referring to FIG. 7, FIG. 7 shows a schematic top view of a capacitor unit according to an embodiment of the disclosure. A capacitor unit 700 includes a first metal layer L1, a second metal layer L2, a third metal layer L3, and a fourth metal layer L4. The second metal layer L2, the third metal layer L3, and the fourth metal layer L4 form an upper electrode of the capacitor unit 700. The first metal layer L1, the second metal layer L2, the third metal layer L3, and the fourth metal layer L4 form a lower electrode of the capacitor unit 700. The upper electrode and the lower electrode are respectively electrodes with different polarities in the capacitor unit 700. The upper electrode and the lower electrode may respectively be, for example but not limited to, a positive electrode and a negative electrode.

In this embodiment, the first metal layer L1, the second metal layer L2, the third metal layer L3 and the fourth metal layer L4 are sequentially stacked in parallel above a substrate (not shown) and along a direction Z. The first metal layer L1, the second metal layer L2, the third metal layer L3 and the fourth metal layer L4 may be separated from each other by a dielectric material. For example, the dielectric material may be a material having high dielectric constant characteristics, such as silicon dioxide ($SiO_2$) or aluminum oxide ($Al_2O_3$).

In this embodiment, the first metal layer L1 includes a patterned metal part B1 of the lower electrode, and connection vias V1 and V2. The second metal layer L2 includes a patterned metal part T2 of the upper electrode, a patterned metal part B2 of the lower electrode, and connection vias V3, V4, V5, V6 and V7. The third metal layer L3 includes a patterned metal part T3 of the upper electrode, a patterned metal part B3 of the lower electrode, and connection vias V8, V9, V10, V11 and V12. The fourth metal layer L4 includes a patterned metal part T4 of the upper electrode, and patterned metal parts B4_1 and B4_2 of the lower electrode.

In this embodiment, the patterned metal parts B1, B2, B3, B4_1 and B4_2 of the lower electrode may respectively be electrically connected via the connection vias V1, V2, V5, V6, V7, V11 and V12. The patterned metal parts T2, T3 and T4 of the upper electrode may be electrically connected via the connection vias V3, V4, V8, V9 and V10. In this way, a capacitor can be formed between the upper electrode and the lower electrode of the capacitor unit 700. Referring to FIG. 6 and FIG. 7, capacitors can be formed between the lower electrode and the upper electrode between the capacitor units. Therefore, by the above configuration, the additional parasitic capacitance of the capacitor unit 700 can be minimized.

It should be noted that in the embodiment of FIG. 7, the capacitor unit 700 includes four metal layers. However, the disclosure is not limited thereto. The number of metal layers may be increased or decreased in consideration of increasing or decreasing the capacitance.

According to the above, in the layout structure of the disclosure, each first capacitor and each corresponding second capacitor are symmetrical with respect to the reference axis, or each first capacitor and each corresponding second capacitor are separated from each other by the same distance. Moreover, each first capacitor and each corresponding second capacitor have the same capacitance. Moreover, the first capacitor array and the second capacitor array respectively form identical rectangles. Furthermore, in an embodiment of the disclosure, multiple signal transmission wires may respectively be coupled to multiple first capacitors and multiple second capacitors via the side edges on the same side of the first capacitor array and the second capacitor array. In an embodiment of the disclosure, each capacitor may be composed of capacitor units that are particularly disposed. In this way, the layout structure has minimal additional parasitic capacitance and can be easily integrated with other circuits.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A layout structure adapted for a signal format converter, comprising:
 a first capacitor array, disposed on one side of a reference axis, the first capacitor array comprising a plurality of first capacitor units, the plurality of first capacitor units forming a plurality of first capacitors, the plurality of first capacitors respectively having a plurality of first capacitances;
 a second capacitor array, disposed on the other side of the reference axis, the second capacitor array comprising a plurality of second capacitor units, the plurality of second capacitor units forming a plurality of second capacitors, the plurality of second capacitors respectively having a plurality of second capacitances,
 a first compensation capacitor block, wherein a first side edge of the first capacitor array is adjacent to the reference axis, and the first compensation capacitor block is disposed between the first side edge of the first capacitor array and the reference axis; and
 a second compensation capacitor block, wherein a first side edge of the second capacitor array is adjacent to the reference axis, and the second compensation capacitor block is disposed between the first side edge of the second capacitor array and the reference axis,
 wherein the first compensation capacitor block comprises a plurality of first compensation capacitor units, the second compensation capacitor block comprises a plurality of second compensation capacitor units, and each of the plurality of first compensation capacitor units and each of the plurality of second compensation capacitor units have the same structure,
 wherein the plurality of first capacitors respectively correspond to the plurality of second capacitors, each of the plurality of first capacitors and each of the plurality of second capacitors corresponding thereto are symmetrical with respect to the reference axis, or each of the plurality of first capacitors and each of the plurality of second capacitors corresponding thereto are separated from each other by the same distance, and each of the plurality of first capacitors and each of the plurality of second capacitors corresponding thereto have the same capacitance.

2. The layout structure according to claim 1, wherein the first capacitor array and the second capacitor array form identical rectangles.

3. The layout structure according to claim 1, wherein the plurality of first capacitances form a first geometric sequence, the plurality of second capacitances form a second geometric sequence, and the first geometric sequence and the second geometric sequence have the same common ratio.

4. The layout structure according to claim 1, wherein each of the plurality of first capacitor units and the plurality of second capacitor units has the same structure.

5. The layout structure according to claim 1, wherein each of the plurality of first capacitors has a stepped shape, an L shape, a U shape or a rectangular shape, and each of the plurality of first capacitors has the same shape as each of the plurality of second capacitors corresponding thereto.

6. The layout structure according to claim 1, further comprising:
   a redundant capacitor block, disposed between the first compensation capacitor block and the second compensation capacitor block and comprising a plurality of redundant capacitor units.

7. The layout structure according to claim 1, further comprising:
   a third compensation capacitor block, a first redundant capacitor block and a fourth compensation capacitor block, sequentially disposed outside a second side edge of the first capacitor array, wherein the first side edge of the first capacitor array is opposite the second side edge of the first capacitor array; and
   a fifth compensation capacitor block, a second redundant capacitor block and a sixth compensation capacitor block, sequentially disposed outside a second side edge of the second capacitor array, wherein the first side edge of the second capacitor array is opposite the second side edge of the second capacitor array.

8. The layout structure according to claim 1, further comprising:
   a third redundant capacitor block, disposed outside a third side edge of each of the first capacitor array and the second capacitor array along a first direction, wherein the first direction is orthogonal to an extension direction of the reference axis; and
   a fourth redundant capacitor block, disposed outside a fourth side edge of each of the first capacitor array and the second capacitor array along the first direction, wherein the fourth side edge is opposite the third side edge.

9. The layout structure according to claim 8, further comprising:
   a plurality of signal transmission wires, coupled to the plurality of first capacitors and the plurality of second capacitors via the third side edge of each of the first capacitor array and the second capacitor array.

* * * * *